US011600530B2

United States Patent
Lee et al.

(10) Patent No.: US 11,600,530 B2
(45) Date of Patent: Mar. 7, 2023

(54) SEMICONDUCTOR DEVICE AND METHOD OF MANUFACTURE

(71) Applicant: Taiwan Semiconductor Manufacturing Company, Ltd., Hsinchu (TW)

(72) Inventors: Chun-Yi Lee, Hsinchu (TW); Hong-Hsien Ke, Changhua County (TW); Chung-Ting Ko, Kaohsiung (TW); Chia-Hui Lin, Dajia Township (TW); Jr-Hung Li, Chupei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 305 days.

(21) Appl. No.: 16/213,140

(22) Filed: Dec. 7, 2018

(65) Prior Publication Data

US 2020/0043799 A1 Feb. 6, 2020

Related U.S. Application Data

(60) Provisional application No. 62/712,885, filed on Jul. 31, 2018.

(51) Int. Cl.
*H01L 21/8234* (2006.01)
*H01L 21/02* (2006.01)
(Continued)

(52) U.S. Cl.
CPC .... *H01L 21/823468* (2013.01); *C23C 16/345* (2013.01); *C23C 16/45542* (2013.01);
(Continued)

(58) Field of Classification Search
None
See application file for complete search history.

(56) References Cited

U.S. PATENT DOCUMENTS 6,428,859 B1 * 8/2002 Chiang ............ C23C 16/45525 427/123
6,991,979 B2 1/2006 Ajmera et al.
(Continued)

FOREIGN PATENT DOCUMENTS

KR 20090012573 A 2/2009
TW 201439105 A 10/2014
(Continued)

OTHER PUBLICATIONS

Faraz et al. Tuning Material Properties of Oxides and Nitrides by Substrate Biasing during Plasma-Enhanced Atomic Layer Deposition on Planar and 3D Substrate Topographies. ACS Appl. Mater. Interfaces 2018, 10, 15, 13158-13180.*
(Continued)

*Primary Examiner* — Erik T. K. Peterson
(74) *Attorney, Agent, or Firm* — Slater Matsil, LLP

(57) ABSTRACT

An etch stop layer is formed over a semiconductor fin and gate stack. The etch stop layer is formed utilizing a series of pulses of precursor materials. A first pulse introduces a first precursor material to the semiconductor fin and gate stack. A second pulse introduces a second precursor material, which is turned into a plasma and then directed towards the semiconductor fin and gate stack in an anisotropic deposition process. As such, a thickness of the etch stop layer along a bottom surface is larger than a thickness of the etch stop layer along sidewalls.

20 Claims, 14 Drawing Sheets

(51) Int. Cl.

| | |
|---|---|
| ***H01L 21/311*** | (2006.01) |
| ***C23C 16/34*** | (2006.01) |
| ***C23C 16/455*** | (2006.01) |

(52) U.S. Cl.

CPC ...... *H01L 21/0217* (2013.01); *H01L 21/0228* (2013.01); *H01L 21/02211* (2013.01); *H01L 21/31116* (2013.01); *H01L 21/823431* (2013.01); *H01L 21/823437* (2013.01); *H01L 21/823475* (2013.01)

(56) References Cited

U.S. PATENT DOCUMENTS 8,053,372 B1 * 11/2011 Greer ................ H01J 37/32137 438/762
10,262,854 B2 * 4/2019 Chen ................... H01L 21/0228
10,312,055 B2 * 6/2019 Suzuki .............. H01L 21/02219
10,490,400 B2 * 11/2019 Harada ............. H01L 21/02274
10,714,335 B2 * 7/2020 Kim ........................ C23C 16/50
10,741,386 B2 * 8/2020 Chen ................... H01L 21/0228
2006/0189053 A1 8/2006 Wang et al.
2006/0211224 A1 * 9/2006 Matsuda ........... C23C 16/45544 438/493
2006/0211243 A1 * 9/2006 Ishizaka ............ C23C 16/45538 438/680
2008/0054314 A1 3/2008 Frohberg et al.
2008/0064176 A1 * 3/2008 Chou .................. H01L 29/6653 438/303
2009/0032881 A1 2/2009 Lee et al.
2013/0109154 A1 * 5/2013 Nishikawa ........ H01L 21/02211 438/478
2014/0113457 A1 * 4/2014 Sims ..................... C23C 16/045 438/792
2014/0227861 A1 * 8/2014 Wu ................... H01J 37/32706 438/468
2014/0273524 A1 * 9/2014 Nguyen ............ H01L 21/02321 438/783
2014/0273528 A1 * 9/2014 Niskanen .......... H01L 29/66795 438/792
2015/0364559 A1 12/2015 Wang
2016/0049291 A1 * 2/2016 Kim .................. H01L 21/02277 438/478
2016/0079054 A1 * 3/2016 Chen ..................... C23C 16/045 438/762
2016/0148800 A1 * 5/2016 Henri .................... C23C 16/045 438/485
2016/0379925 A1 12/2016 Ok et al.
2017/0062204 A1 * 3/2017 Suzuki .............. C23C 16/45553
2017/0092856 A1 * 3/2017 Henri .................. H01L 45/1233
2017/0107621 A1 * 4/2017 Suemori ................. C23C 16/52
2017/0222008 A1 8/2017 Hsu et al.
2017/0243734 A1 * 8/2017 Ishikawa ........... H01L 21/02274
2017/0250068 A1 * 8/2017 Ishikawa ........... H01L 21/31111
2017/0278743 A1 * 9/2017 Tsai .................. H01L 21/76814
2017/0316940 A1 * 11/2017 Ishikawa ............. H01L 21/0337
2018/0033616 A1 * 2/2018 Masaru ............... C23C 16/0245
2018/0040733 A1 2/2018 Chang et al.
2018/0138405 A1 * 5/2018 McKerrow ............. H01L 45/12
2018/0151419 A1 * 5/2018 Wu ................... H01L 21/76822
2018/0308681 A1 * 10/2018 Harada ............. H01L 21/76224
2019/0057858 A1 * 2/2019 Hausmann ........ H01L 21/02181
2019/0295838 A1 * 9/2019 Chen ..................... C23C 16/045
2019/0385902 A1 * 12/2019 Wang ................ H01L 21/76802

FOREIGN PATENT DOCUMENTS

TW 201740462 A 11/2017
TW 201818504 A 5/2018
TW 201820478 A 6/2018
WO 2013154842 A1 10/2013

OTHER PUBLICATIONS

Puurunen et al. Island growth as a growth mode in atomic layer deposition: A phenomenological model. J. Appl. Phys. 96, 7686 (2004); https://doi.org/10.1063/1.1810193 (Year: 2004).*

King, SW, Plasma enhanced atomic layer deposition of SiNx:H and SiO2. J. Vac. Sci. Technol. A 29, 041501 (2011); https://doi.org/10.1116/1.3584790 (Year: 2011).*

Jang et al. Temperature dependence of silicon nitride deposited by remote plasma atomic layer deposition. Phys. Status Solidi A 211, No. 9, 2166-2171 (2014) / DOI 10.1002/pssa.201431162 (Year: 2014).*

Weeks et al. Plasma enhanced atomic layer deposition of silicon nitride using neopentasilane. J. Vac. Sci. Technol. A 34, 01A140 (2016); https://doi.org/10.1116/1.4937993 (Year: 2016).*

Knoops et al. Atomic Layer Deposition of Silicon Nitride from Bis(tertbutylamino)silane and N2 Plasma. ACS Appl. Mater. Interfaces 2015, 7, 19857-19862 (Year: 2015).*

Ande et al. Role of Surface Termination in Atomic Layer Deposition of Silicon Nitride. J. Phys. Chem. Lett. 2015, 6, 3610-3614 (Year: 2015).*

Andringa et al. Low-Temperature Plasma-Assisted Atomic Layer Deposition of Silicon Nitride Moisture Permeation Barrier Layers. ACS Appl. Mater. Interfaces 2015, 7, 22525-22532 (Year: 2015).*

Meng X, Byun YC, Kim HS, Lee JS, Lucero AT, Cheng L, Kim J. Atomic Layer Deposition of Silicon Nitride Thin Films: A Review of Recent Progress, Challenges, and Outlooks. Materials (Basel). Dec. 12, 2016;9(12):1007. doi: 10.3390/ma9121007 (Year: 2016).*

Provine et al. Correlation of film density and wet etch rate in hydrofluoric acid of plasma enhanced atomic layer deposited silicon nitride. AIP Advances 6, 065012 (2016); https://doi.org/10.1063/1.4954238 (Year: 2016).*

Dendooven et al. Basics of Atomic Layer Deposition: Growth Characteristics and Conformality. Atomic Layer Deposition in Energy Conversion Applications, pp. 1-40, First Edition. 2017, Wiley-VCH Verlag GmbH & Co. KGaA. (Year: 2017).*

Sønsteby et al. Consistency and reproducibility in atomic layer deposition. J. Vac. Sci. Technol. A 38, 020804 (2020); doi: 10.1116/1.5140603 (Year: 2020).*

* cited by examiner

SEMICONDUCTOR DEVICE AND METHOD OF MANUFACTURE

PRIORITY CLAIM AND CROSS-REFERENCE

This application claims the benefit of U.S. Provisional Application No. 62/712,885, filed on Jul. 31, 2018, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
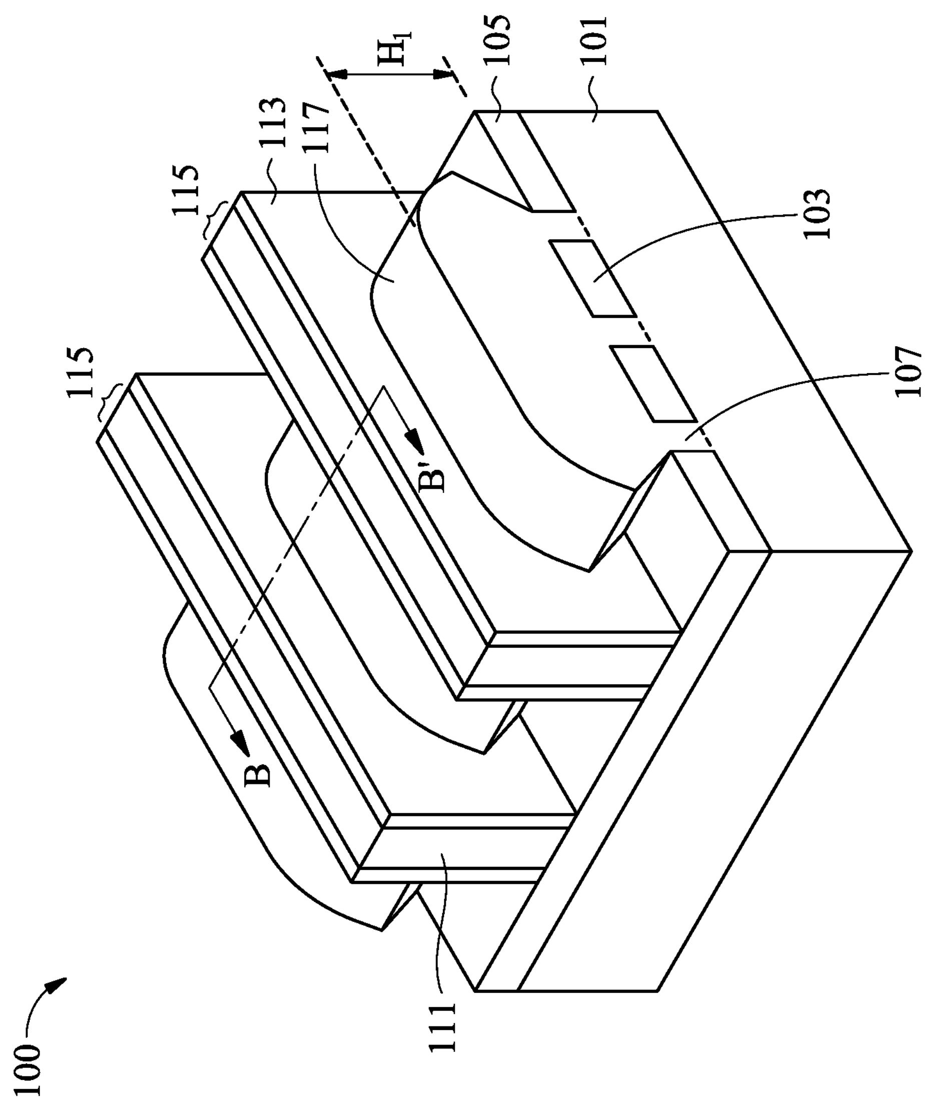
FIGS. 1A-1B illustrate a gate stack formed over a semiconductor fin, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
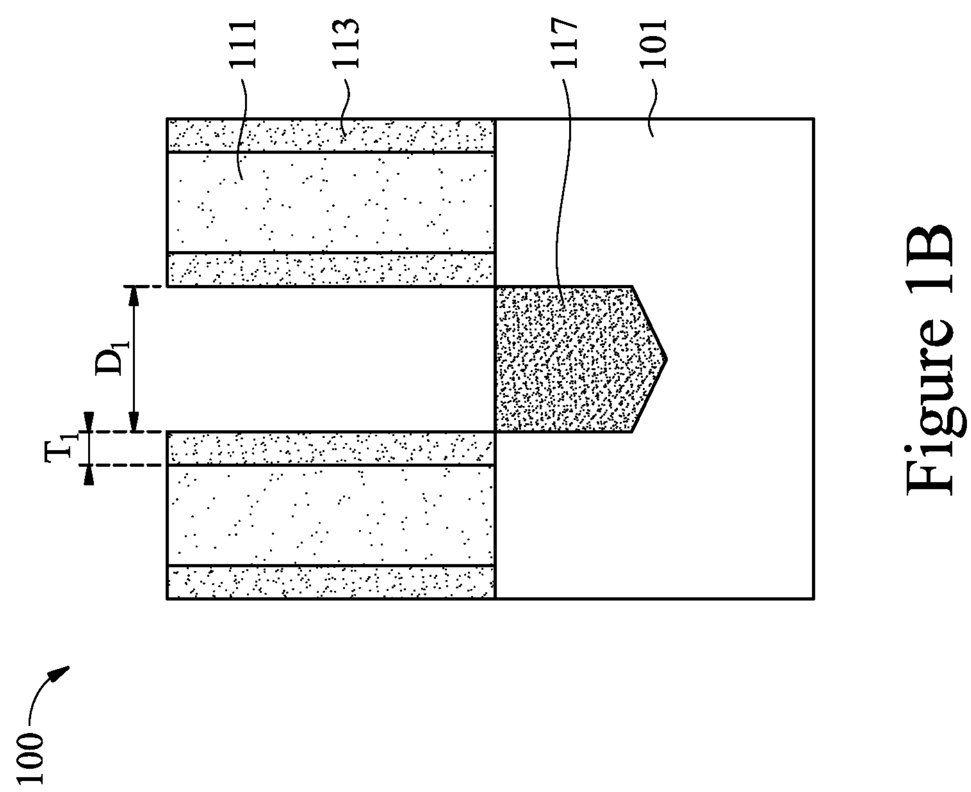

With reference now to FIGS. 1A and 1B (with FIG. 1B illustrating a cross-sectional view of FIG. 1A through line B-B' in FIG. 1A), there is illustrated a perspective view of a semiconductor device 100 such as a finFET device. In an embodiment the semiconductor device 100 comprises a substrate 101 with first trenches 103 formed therein. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

The first trenches 103 may be formed as an initial step in the eventual formation of first isolation regions 105. The first trenches 103 may be formed using a masking layer (not separately illustrated in FIG. 1A) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally forms fins 107 from those portions of the substrate 101 that remain unremoved. For convenience the fins 107 have been illustrated in the figures as being separated from the substrate 101 by a dashed line, although a physical indication of the separation may or may not be present. These fins 107 may be used, as discussed below, to form the channel region of multiple-gate FinFET transistors. While FIG. 1A only illustrates three fins 107 formed from the substrate 101, any number of fins 107 may be utilized.

The fins 107 may be formed such that they have a width at the surface of the substrate 101 of between about 5 nm and about 80 nm, such as about 30 nm. Additionally, the fins 107 may be spaced apart from each other by a distance of between about 10 nm and about 100 nm, such as about 50 nm. By spacing the fins 107 in such a fashion, the fins 107 may each form a separate channel region while still being close enough to share a common gate (discussed further below).

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 50 Å and about 500 Å, such as about 400 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, a dummy gate dielectric (or interface oxide), a dummy gate electrode 111 over the dummy gate dielectric, and first spacers 113 may be formed over each of the fins 107. In an embodiment the dummy gate dielectric may be formed by thermal oxidation, chemical vapor deposition, sputtering, or any other methods known and used in the art for forming a gate dielectric. Depending on the technique of gate dielectric formation, the dummy gate dielectric thickness on the top of the fins 107 may be different from the gate dielectric thickness on the sidewall of the fins 107.

The dummy gate dielectric may comprise a material such as silicon dioxide or silicon oxynitride with a thickness ranging from about 3 angstroms to about 100 angstroms, such as about 10 angstroms. The dummy gate dielectric may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric.

The dummy gate electrode 111 may comprise a conductive material and may be selected from a group comprising of polysilicon (e.g., a dummy polysilicon (DPO)), W, Al, Cu, AlCu, Ti, TiAlN, TaC, TaCN, TaSiN, Mn, Zr, TiN, Ta, TaN, Co, Ni, combinations of these, or the like. The dummy gate electrode 111 may be deposited by chemical vapor deposition (CVD), sputter deposition, or other techniques known and used in the art for depositing conductive materials. The thickness of the dummy gate electrode 111 may be in the range of about 5 Å to about 200 Å. The top surface of the dummy gate electrode 111 may have a non-planar top surface, and may be planarized prior to patterning of the dummy gate electrode 111 or gate etch. Ions may or may not be introduced into the dummy gate electrode 111 at this point. Ions may be introduced, for example, by ion implantation techniques.

Once formed, the dummy gate dielectric and the dummy gate electrode 111 may be patterned to form a series of stacks 115 over the fins 107. The stacks 115 define multiple channel regions located on each side of the fins 107 beneath the dummy gate dielectric. The stacks 115 may be formed by depositing and patterning a gate mask (not separately illustrated in FIG. 1A) on the dummy gate electrode 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode 111 and the dummy gate dielectric may be etched using a dry etching process to form the patterned stacks 115.

Once the stacks 115 have been patterned, the first spacers 113 may be formed. The first spacers 113 may be formed on opposing sides of the stacks 115. The first spacers 113 are typically formed by blanket depositing a spacer layer (not separately illustrated in FIG. 1A) on the previously formed structure. The spacer layer may comprise SICON, SiN, oxynitride, SiC, SiON, SiOC, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 105. The first spacers 113 may then be patterned, such as by one or more etches to remove the spacer layer from the horizontal surfaces of the structure, to form the first spacers 113.

In an embodiment the first spacers 113 may be formed to have a first thickness $T_1$ of between about 10 Å and about 100 Å. Additionally, once the first spacers 113 have been formed, a first spacer 113 adjacent to one stack 115 may be separated from a first spacer 113 adjacent to another stack 115 by a first distance $D_1$ of between about 50 Å and about 500 Å, such as about 200 Å. However, any suitable thicknesses and distances may be utilized.

Once the first spacers 113 have been formed, a removal of the fins 107 from those areas not protected by the stacks 115 and the first spacers 113 and a regrowth of source/drain regions 117 may be performed. The removal of the fins 107 from those areas not protected by the stacks 115 and the first spacers 113 may be performed by a reactive ion etch (RIE) using the stacks 115 and the first spacers 113 as hardmasks, or by any other suitable removal process. The removal may be continued until the fins 107 are either planar with (as illustrated) or below the surface of the first isolation regions 105.

Once these portions of the fins 107 have been removed, a hard mask (not separately illustrated), is placed and patterned to cover the dummy gate electrode 111 to prevent growth thereon and the source/drain regions 117 may be regrown in contact with each of the fins 107. In an embodiment the source/drain regions 117 may be regrown and, in some embodiments the source/drain regions 117 may be regrown to form a stressor that will impart a stress to the channel regions of the fins 107 located underneath the stacks 115. In an embodiment wherein the fins 107 comprise silicon and the FinFET is a p-type device, the source/drain regions 117 may be regrown through a selective epitaxial process with a material, such as silicon, silicon germanium, silicon phosphorous, that has a different lattice constant than the channel regions. The epitaxial growth process may use precursors such as silane, dichlorosilane, germane, and the like, and may continue for between about 5 minutes and about 120 minutes, such as about 30 minutes. In other embodiments the source/drain regions 117 may comprise materials such as GaAs, GaP, GaN, InP, InAs, InSb, GaAsP, AlGaN, AlInAs, AlGaAs, GaInAs, GaInP, and/or GaInAsP; or combinations, or the like.

Once the source/drain regions 117 are formed, dopants may be implanted into the source/drain regions 117 by implanting appropriate dopants to complement the dopants in the fins 107. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the stacks 115 and the first spacers 113 as masks. It should be noted that one of ordinary skill in the art will realize that many other processes, steps, or the like may be used to implant the dopants. For example, one of ordinary skill in the art will realize that a plurality of implantation processes may be performed using various combinations of spacers and liners to form source/drain regions having a specific shape or characteristic suitable for a particular purpose. Any of these processes may be used to implant the dopants, and the above description is not meant to limit the present embodiments to the steps presented above.

Additionally at this point the hard mask that covered the dummy gate electrode 111 during the formation of the source/drain regions 117 is removed. In an embodiment the hard mask may be removed using, e.g., a wet or dry etching process that is selective to the material of the hard mask. However, any suitable removal process may be utilized.

Figure 2A:
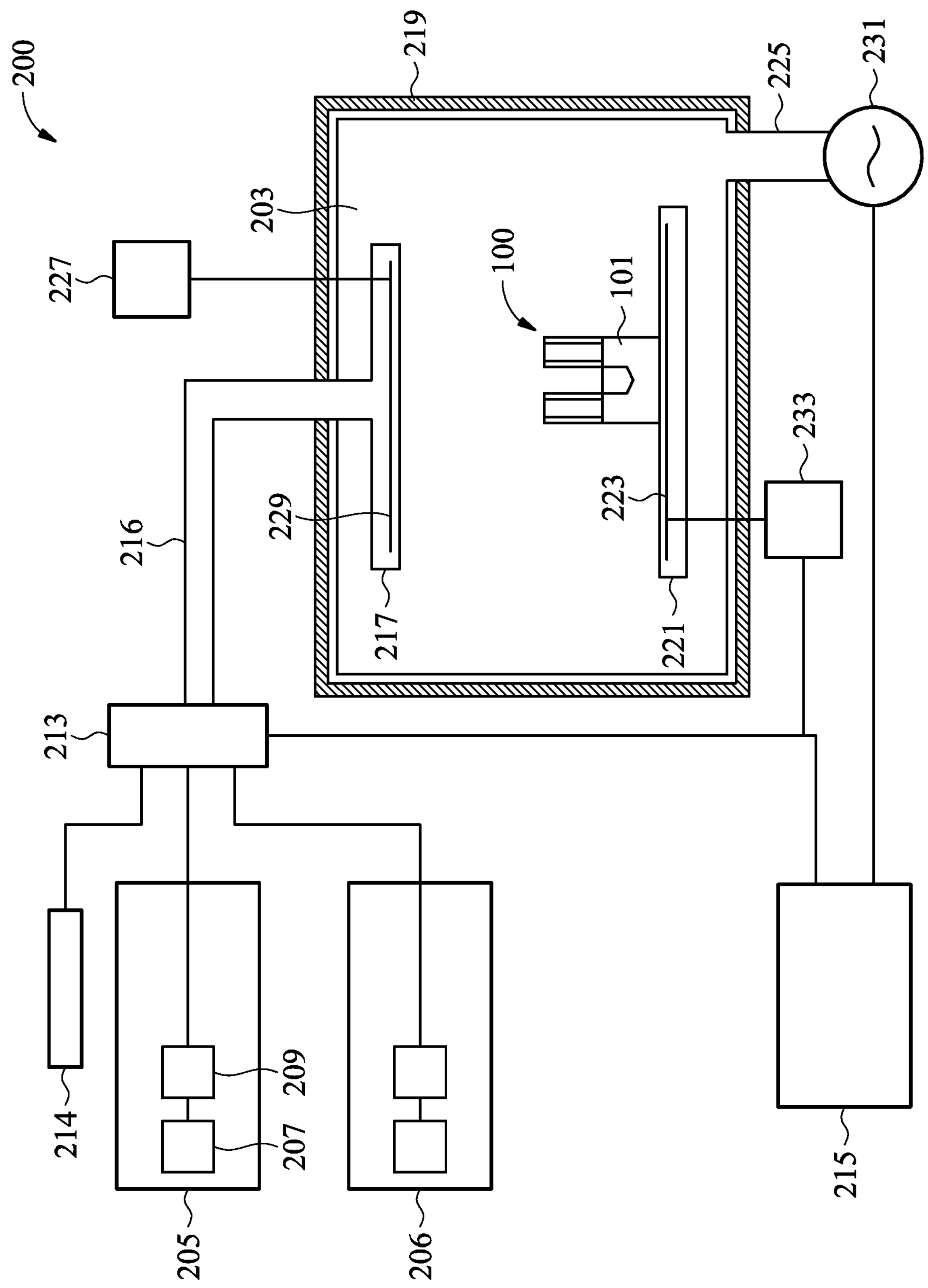
FIGS. 2A-2C illustrates a first step in a deposition process in accordance with some embodiments.
Figure 2B:
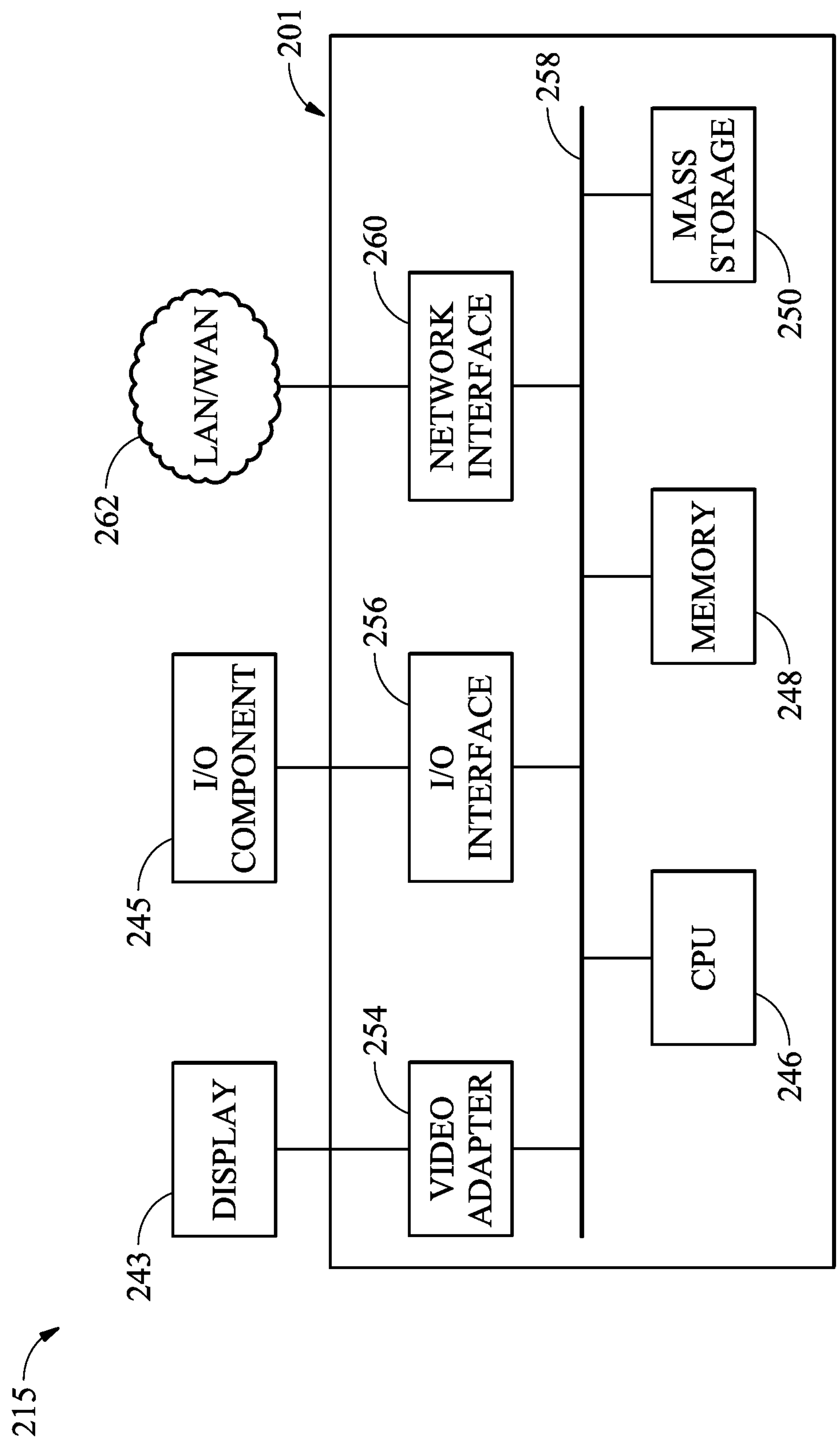

FIGS. 2A-2B illustrate a deposition system 200 that may be utilized to receive precursor materials from a first precursor delivery system 205 and a second precursor delivery system 206 and form layers of materials onto the substrate 101. In an embodiment the first precursor delivery system 205 and the second precursor delivery system 206 may work in conjunction with one another to supply the various different precursor materials to a deposition chamber 203 wherein the substrate 101 is placed. However, the first precursor delivery system 205 and the second precursor delivery system 206 may have physical components that are similar with each other.

For example, the first precursor delivery system 205 and the second precursor delivery system 206 may each include a gas supply 207 and a flow controller 209 (labeled in FIG. 2A with regards to the first precursor delivery system 205 but not labeled for clarity with respect to the second precursor delivery system 206). In an embodiment in which the first precursor is stored in a gaseous state, the gas supply 207 may supply the first precursor to the deposition chamber 203. The gas supply 207 may be a vessel, such as a gas storage tank, that is located either locally to the deposition chamber 203 or else may be located remotely from the deposition chamber 203. In another embodiment, the gas supply 207 may be a facility that independently prepares and delivers the first precursor to the flow controller 209. Any suitable source for the first precursor may be utilized as the gas supply 207, and all such sources are fully intended to be included within the scope of the embodiments.

The gas supply 207 may supply the desired precursor to the flow controller 209. The flow controller 209 may be utilized to control the flow of the precursor to the precursor gas controller 213 and, eventually, to the deposition chamber 203, thereby also helping to control the pressure within the deposition chamber 203. The flow controller 209 may be, e.g., a proportional valve, a modulating valve, a needle valve, a pressure regulator, a mass flow controller, combinations of these, or the like. However, any suitable method for controlling and regulating the flow of the gas to the precursor gas controller 213 may be utilized, and all such components and methods are fully intended to be included within the scope of the embodiments.

However, as one of ordinary skill in the art will recognize, while the first precursor delivery system 205 and the second precursor delivery system 206 have been described herein as having identical components, this is merely an illustrative example and is not intended to limit the embodiments in any fashion. Any type of suitable precursor delivery system, with any type and number of individual components identical to or different from any of the other precursor delivery systems within the deposition system 200, may be utilized. All such precursor systems are fully intended to be included within the scope of the embodiments.

Additionally, in an embodiment in which the first precursor is stored in a solid or liquid state, the gas supply 207 may store a carrier gas and the carrier gas may be introduced into a precursor canister (not separately illustrated), which stores the first precursor in the solid or liquid state. The carrier gas is then used to push and carry the first precursor as it either evaporates or sublimates into a gaseous section of the precursor canister before being sent to the precursor gas controller 213. Any suitable method and combination of units may be utilized to provide the first precursor, and all such combination of units are fully intended to be included within the scope of the embodiments.

The first precursor delivery system 205 and the second precursor delivery system 206 may supply their individual precursor materials into a precursor gas controller 213. The precursor gas controller 213 connects and isolates the first precursor delivery system 205 and the second precursor delivery system 206 from the deposition chamber 203 in order to deliver the desired precursor materials to the deposition chamber 203. The precursor gas controller 213 may include such devices as valves, flow meters, sensors, and the like to control the delivery rates of each of the precursors, and may be controlled by instructions received from the control unit 215 (described further below with respect to FIG. 2B).

The precursor gas controller 213, upon receiving instructions from the control unit 215, may open and close valves so as to connect one or more of the first precursor delivery system 205 and the second precursor delivery system 206 to the deposition chamber 203 and direct a desired precursor material through a manifold 216, into the deposition chamber 203, and to a showerhead 217. The showerhead 217 may be utilized to disperse the chosen precursor material(s) into the deposition chamber 203 and may be designed to evenly disperse the precursor material in order to minimize undesired process conditions that may arise from uneven dispersal. In an embodiment the showerhead 217 may have a circular design with openings dispersed evenly around the showerhead 217 to allow for the dispersal of the desired precursor material into the deposition chamber 203.

However, as one of ordinary skill in the art will recognize, the introduction of precursor materials to the deposition chamber 203 through a single showerhead 217 or through a single point of introduction as described above is intended to be illustrative only and is not intended to be limiting to the embodiments. Any number of separate and independent showerheads 217 or other openings to introduce precursor materials into the deposition chamber 203 may be utilized. All such combinations of showerheads and other points of introduction are fully intended to be included within the scope of the embodiments.

The deposition chamber 203 may receive the desired precursor materials and expose the precursor materials to the semiconductor device 100, and the deposition chamber 203 may be any desired shape that may be suitable for dispersing the precursor materials and contacting the precursor materials with the semiconductor device 100. In the embodiment illustrated in FIG. 2A, the deposition chamber 203 has a cylindrical sidewall and a bottom. However, the deposition chamber 203 is not limited to a cylindrical shape, and any other suitable shape, such as a hollow square tube, an octagonal shape, or the like, may be utilized. Furthermore, the deposition chamber 203 may be surrounded by a housing 219 made of material that is inert to the various process materials. As such, while the housing 219 may be any suitable material that can withstand the chemistries and pressures involved in the deposition process, in an embodiment the housing 219 may be steel, stainless steel, nickel, aluminum, alloys of these, combinations of these, and like.

Within the deposition chamber 203 the substrate 101 may be placed on a mounting platform 221 in order to position and control the substrate 101 and the semiconductor device 100 during the deposition processes. The mounting platform 221 may include heating mechanisms in order to heat the substrate 101 during the deposition processes. Furthermore, while a single mounting platform 221 is illustrated in FIG. 2A, any number of mounting platforms 221 may additionally be included within the deposition chamber 203.

Additionally, the deposition chamber 203 and the mounting platform 221 may be part of a cluster tool system (not shown). The cluster tool system may be used in conjunction with an automated handling system in order to position and place the substrate 101 into the deposition chamber 203 prior to the deposition processes, position, hold the substrate 101 during the deposition processes, and remove the substrate 101 from the deposition chamber 203 after the deposition processes.

The deposition chamber 203 may also have an exhaust outlet 225 for exhaust gases to exit the deposition chamber 203. A vacuum pump 231 may be connected to the exhaust outlet 225 of the deposition chamber 203 in order to help evacuate the exhaust gases. The vacuum pump 231, under control of the control unit 215, may also be utilized to reduce and control the pressure within the deposition chamber 203 to a desired pressure and may also be utilized to evacuate precursor materials from the deposition chamber 203 in preparation for the introduction of the next precursor material.

FIG. 2B illustrates an embodiment of the control unit 215 that may be utilized to control the precursor gas controller 213 and the vacuum pump 231 (as illustrated in FIG. 2A). The control unit 215 may be any form of computer processor that can be used in an industrial setting for controlling process machines. In an embodiment the control unit 215 may comprise a processing unit 201, such as a desktop computer, a workstation, a laptop computer, or a dedicated unit customized for a particular application. The control unit 215 may be equipped with a display 243 and one or more input/output components 245, such as instruction outputs, sensor inputs, a mouse, a keyboard, printer, combinations of these, or the like. The processing unit 201 may include a central processing unit (CPU) 246, memory 248, a mass storage device 250, a video adapter 254, and an I/O interface 256 connected to a bus 258.

The bus 258 may be one or more of any type of several bus architectures including a memory bus or memory controller, a peripheral bus, or video bus. The CPU 246 may comprise any type of electronic data processor, and the memory 248 may comprise any type of system memory, such as static random access memory (SRAM), dynamic random access memory (DRAM), or read-only memory (ROM). The mass storage device 250 may comprise any type of storage device configured to store data, programs, and other information and to make the data, programs, and other information accessible via the bus 258. The mass storage device 250 may comprise, for example, one or more of a hard disk drive, a magnetic disk drive, or an optical disk drive.

The video adapter 254 and the I/O interface 256 provide interfaces to couple external input and output devices to the processing unit 201. As illustrated in FIG. 2B, examples of input and output devices include the display 243 coupled to the video adapter 254 and the I/O component 245, such as a mouse, keyboard, printer, and the like, coupled to the I/O interface 256. Other devices may be coupled to the processing unit 201, and additional or fewer interface cards may be utilized. For example, a serial interface card (not shown) may be used to provide a serial interface for a printer. The processing unit 201 also may include a network interface 260 that may be a wired link to a local area network (LAN) or a wide area network (WAN) 262 and/or a wireless link.

It should be noted that the control unit 215 may include other components. For example, the control unit 215 may include power supplies, cables, a motherboard, removable storage media, cases, and the like. These other components, although not shown in FIG. 2B, are considered part of the control unit 215.

Figure 2C:
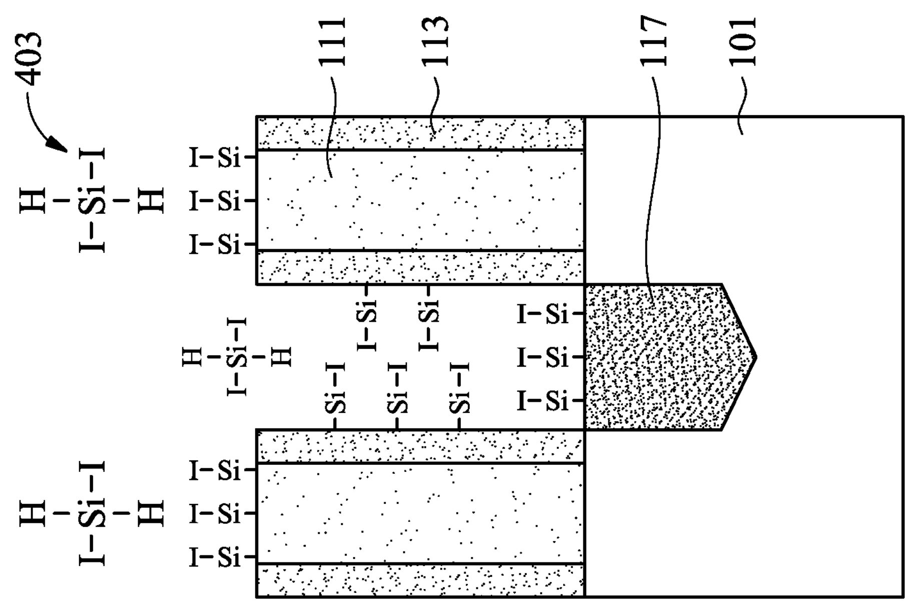

Turning now to FIG. 2C, the deposition system 200 may be utilized to deposit an etch stop layer 401 over the source/drain regions 117 and between the first spacers 113. In an embodiment the etch stop layer 401 may be a dielectric material such as silicon nitride, SiCN, or SiCON. However, any suitable material may be utilized.

In an embodiment the formation of the etch stop layer 401 may be initiated by putting a first precursor material into the first precursor delivery system 205 (see FIG. 2A) for its eventual introduction into the deposition chamber 203 and introduction to the substrate 101 (as illustrated in FIG. 2C). For example, in an embodiment in which the etch stop layer 401 is desired to be a material such as silicon nitride, the first precursor may be one or more of a material such as diiodosilane, dichlorosilane, or silane. However, any suitable first precursor may be utilized.

Additionally, a second precursor material may be placed into the second precursor delivery system 206. In an embodiment the second precursor material is a material that can work in conjunction with the product of the first precursor material to form a monolayer of the desired material. In an embodiment in which the etch stop layer 401 is desired to be silicon nitride and the first precursor material is diiodosilane 403, the second precursor material may be a material such as nitrogen, $NH_3$, or $H_2$. However, any suitable material may be utilized.

Once the first precursor material and the second precursor material have been placed into the first precursor delivery system 205 and the second precursor delivery system 206, respectively, the formation of the etch stop layer 401 may be initiated by the control unit 215 sending an instruction to the precursor gas controller 213 to connect the first precursor delivery system 205 to the deposition chamber 203. Once connected, the first precursor delivery system 205 can deliver the first precursor material to the showerhead 217 through the precursor gas controller 213 and the manifold 216. The showerhead 217 can then disperse the first precursor material into the deposition chamber 203, wherein the first precursor material can be adsorbed and react with each with the exposed surfaces.

In the embodiment to form a layer of silicon nitride, the first precursor material may be flowed into the deposition chamber 203 at a flow rate of between about 5 sccm and about 5 slm, with a carrier gas (e.g., nitrogen) flow rate of between about 5 sccm and about 5 slm, such as about 2 slm. Additionally, the deposition chamber 203 may be held at a pressure of between about 2.5 torr and about 22.5 torr, such as about 2.6 torr, and a temperature of between about 200° C. and about 600° C., such as about 450° C., while in a furnace ALD process the temperature may be between about 200° C. and about 600° C. for a time of between about 1 second and about 1000 seconds. The process of an ALD cycle may continue for a time period of between about 0.01 s and about 10 s, such as about 0.3 seconds. However, as one of ordinary skill in the art will recognize, these process conditions are only intended to be illustrative, as any suitable process conditions may be utilized while remaining within the scope of the embodiments.

In the embodiment in which a layer of silicon nitride is desired to be formed using diiodosilane 403, under these process conditions the diiodosilane 403 will react with the exposed surfaces in order to provide a surface wherein silicon is chemically bonded to the underlying surface while the opposite surface is terminated with iodine atoms which are exposed to the ambient atmosphere within the deposition chamber 203. Additionally, the reaction of the diiodosilane 403 with the underlying structures may be self-limiting, providing a single layer of molecules once this step is completed.

After the self-limiting reaction has finished, the deposition chamber 203 may be purged of the first precursor material. For example, the control unit 215 may instruct the precursor gas controller 213 to disconnect the first precursor delivery system 205 (containing the first precursor material to be purged from the deposition chamber 203) and to connect a purge gas delivery system 214 to deliver a purge gas to the deposition chamber 203. In an embodiment the purge gas delivery system 214 may be a gaseous tank or other facility that provides a purge gas such as nitrogen, argon, xenon, or other gas to the deposition chamber 203, for a purge flow of between about 2 slm and about 20 slm, such as about 10 slm for a time period of between about 0.01 s and about 30 s, such as about 1 second. Additionally, the control unit 215 may also initiate the vacuum pump 231 in order to apply a pressure differential to the deposition chamber 203 to aid in the removal of the first precursor material. The purge gas, along with the vacuum pump 231, may purge the first precursor material from the deposition chamber 203.

Figure 3:
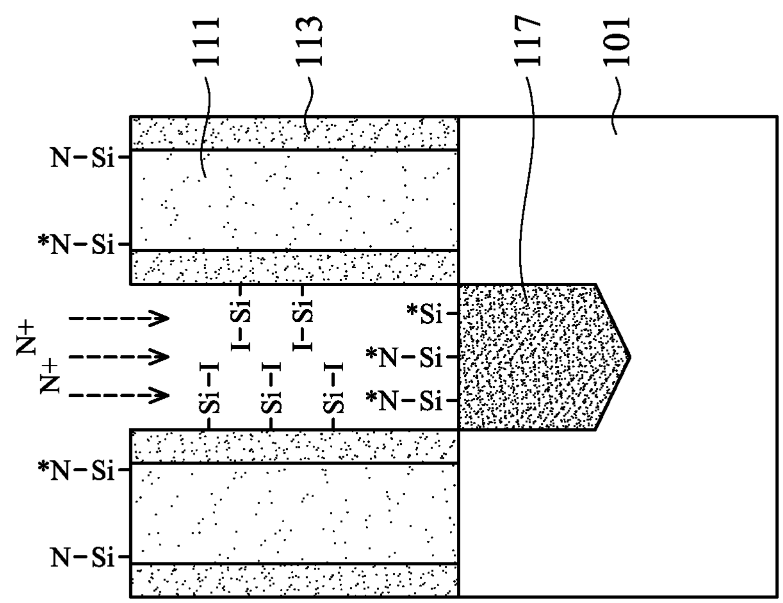
FIG. 3 illustrates a second step in the deposition process in accordance with some embodiments.

FIG. 3 illustrates that, after the purge of the first precursor material has been completed, the introduction of the second precursor material (e.g., nitrogen) to the deposition chamber 203 may be initiated by the control unit 215 sending an instruction to the precursor gas controller 213 to disconnect the purge gas delivery system 214 and to connect the second precursor delivery system 206 (containing the second precursor material) to the deposition chamber 203. Once connected, the second precursor delivery system 206 can deliver the second precursor material to the showerhead 217. The showerhead 217 can then disperse the second precursor material into the deposition chamber 203.

In the embodiment discussed above to form a layer of silicon nitride with diiodosilane 403 and nitrogen, the nitrogen may be introduced into the deposition chamber 203 at a flow rate of between about 5 sccm and about 5 slm, such as about 2 slm, for about 1.6 seconds. Additionally, the deposition chamber 203 may be held at a pressure of between about 2.5 torr and about 22.5 torr, such as about 2.6 torr, and at a temperature of between about 400° C. and about 500° C., such as about 450° C. However, as one of ordinary skill in the art will recognize, these process conditions are only intended to be illustrative, as any suitable process conditions may be utilized while remaining within the scope of the embodiments.

Additionally, while the second precursor material is introduced into the deposition chamber 203, the second precursor material may be ignited into a plasma in order to assist in the deposition process. In this embodiment the mounting platform 221 may additionally comprise a first electrode 223 coupled to a first RF generator 233. The first electrode 223 may be electrically biased by the first RF generator 233 (under control of the control unit 215) at a RF voltage during the deposition process. By being electrically biased, the first electrode 223 is used to provide a bias to the incoming second precursor material as well as assist to ignite the second precursor material into a plasma. Additionally, the first electrode 223 is also utilized to maintain the second precursor plasma during the deposition process by maintaining the bias.

In an embodiment, the showerhead 217 may also be or comprise (or otherwise incorporate) an second electrode 229 for use as a plasma generator to assist in the deposition chamber 203. In an embodiment the plasma generator may be a transformer coupled plasma generator and may be, e.g., a coil. The coil may be attached to a second RF generator 227 that is utilized to provide power to the second electrode 229 (under control of the control unit 215) in order to ignite the plasma during introduction of the second precursor material.

However, while the second electrode 229 is described above as a transformer coupled plasma generator, embodiments are not intended to be limited to a transformer coupled plasma generator. Rather, any suitable method of generating the plasma, such as inductively coupled plasma systems, magnetically enhanced reactive ion etching, electron cyclotron resonance, a remote plasma generator, or the like, may be utilized. All such methods are fully intended to be included within the scope of the embodiments.

Additionally, after ignition of the second precursor material into a second precursor plasma (e.g., a nitrogen plasma), the first electrode 223 and the second electrode 229 within the showerhead 217 may also be utilized to apply a bias and generate an anisotropic growth rate boost to the deposition of the second precursor plasma. In an embodiment the first electrode 223 may be set at a power of between about 0 W and about 1500 W, such as about 0 W, while the second electrode 229 may be set at a power of between about 300 W and about 500 W at a frequency of about 13.56 MHz. Further, the anisotropic deposition in this pulse may be continued for between about 0.01 s and about 30 s, such as about 1.6 s. However, any suitable parameters may be utilized.

During the introduction of the second precursor material, in order to help protect the backside of the mounting platform 221, a seal gas may be introduced along the backside of the mounting platform. In an embodiment the seal gas may be similar to the second precursor material (e.g., nitrogen) but may be in a non-plasma form. Further, the seal gas may be introduced at a rate of about 0.2 slm. However, any suitable seal gas and any suitable flow rate may be utilized.

By utilizing the second precursor plasma along with the bias from the second electrode 229 and the first electrode 223, the second precursor plasma (e.g., nitrogen plasma) can provide an anisotropic growth rate boost to the atomic layer deposition process. In particular, the second precursor plasma, under the influence of the bias from the second electrode 229 and the first electrode 223, will be directed towards the substrate 101 and will react more with the product of the first precursor material that is located along the horizontal surfaces and react less with the product of the first precursor material that is located along vertical surfaces such as the sidewalls of the first spacers 113. As such, while the deposition process is an atomic layer deposition process, the deposition creates a non-conformal monolayer, wherein the horizontal portions (those portions along the horizontal surfaces) are deposited thicker than the vertical portions (those portions along the vertical surfaces).

Additionally, the growth rate of the material of the etch stop layer 401 may be modified on a per cycle basis. In particular, the RF power of the second electrode 229 may be utilized to adjust the per cycle growth rate during the anisotropic deposition process. For example, at an RF power of about 300 W, the growth rate per cycle may be about 0.259 Å/cycle, while at an RF power of about 400 W the growth rate per cycle may be about 0.261 Å/cycle, and at an RF power of about 500 W the growth rate per cycle may be about 0.267 Å/cycle. However, any suitable power and growth rate may be utilized.

After the monolayer of the desired material, e.g., silicon nitride, has been formed, the deposition chamber 203 may be purged (leaving behind the monolayer of the desired material on the substrate 101) using, e.g., a purge gas from the purge gas delivery system 214 for about one second. After the deposition chamber 203 has been purged, a first cycle for the formation of the desired material has been completed, and a second cycle similar to the first cycle may be started. For example, the repeated cycle may introduce the first precursor material, purge with the purge gas, pulse with the second precursor (using the anisotropic deposition process utilizing plasma), and purge with the purge gas. These cycles may be repeated between about 10 times and about 1000 times, such as 400 times.

Figure 4A:
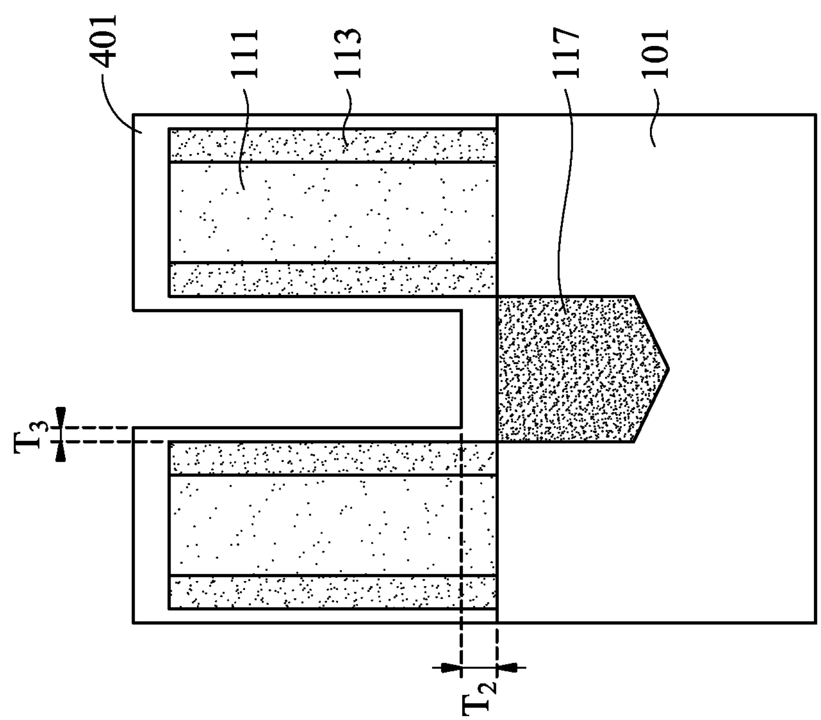
FIGS. 4A-4B illustrates a formation of an etch stop layer using the deposition process in accordance with some embodiments.

FIG. 4A illustrates that, because of the anisotropic deposition process utilized with the pulse of the second precursor material, the etch stop layer 401 will have a different thickness along the sidewalls of the first spacers 113 than along the bottom of the opening or along the top of the stacks 115. For example, along the bottom of the opening the etch stop layer 401 may have a second thickness $T_2$ of between about 10 Å and about 100 Å, such as about 60 Å. Additionally, the etch stop layer 401 may have a third thickness $T_3$ along the sidewalls of between about 0 Å and about 80 Å, such as about 40 Å. However, any suitable thickness may be utilized.

Figure 4B:
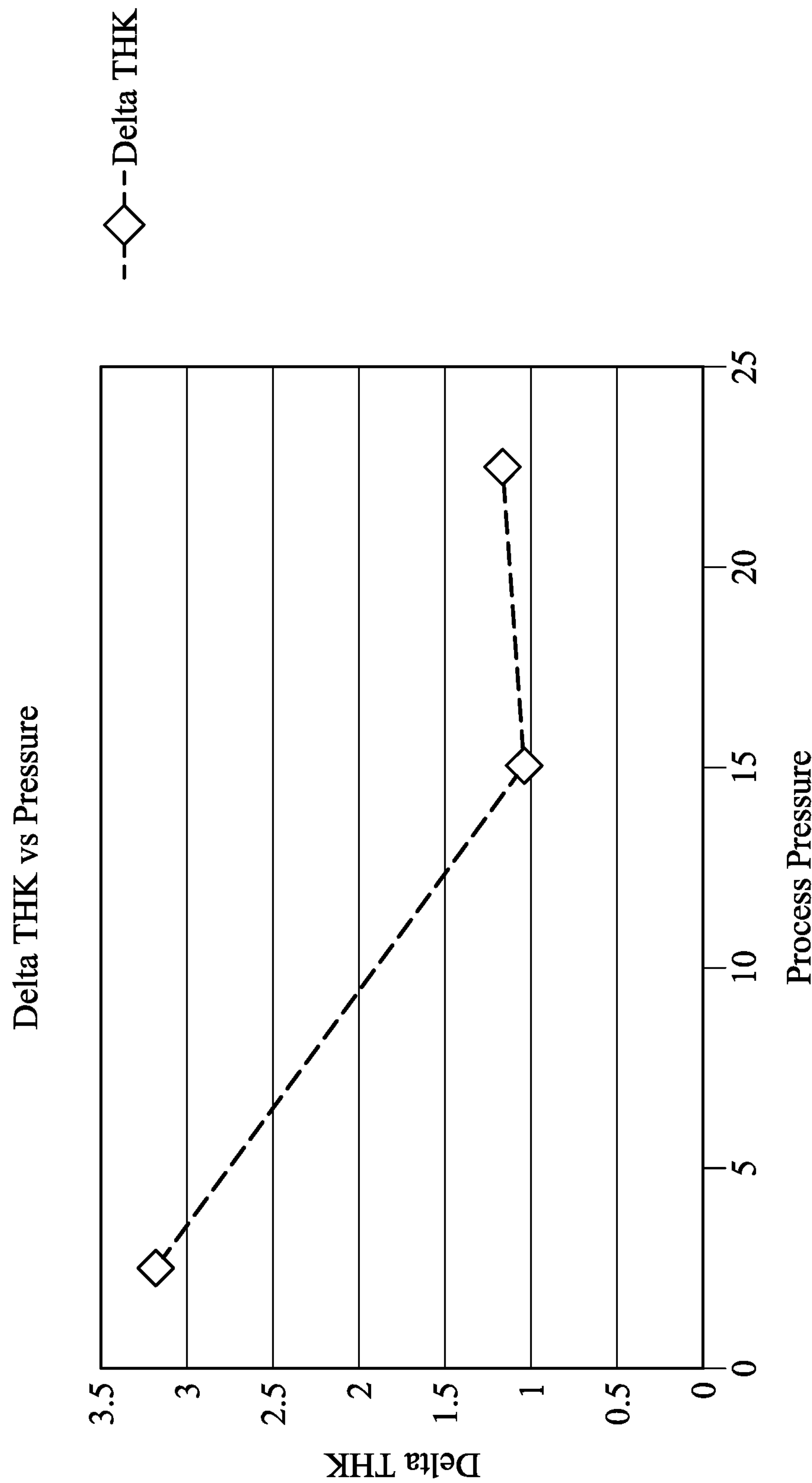

Additionally, the pressure window may be utilized in order to help control the thickness difference between the second thickness $T_2$ and the third thickness $T_3$. For example, an illustrated in FIG. 4B, by choosing the pressure that is utilized for the overall deposition process (e.g., the pressure that is maintained as a constant for each cycle of the same deposition process), the difference in thicknesses between separately deposited layers may be set as desired. For example, at a pressure of 2.6 torr, a difference in thickness between the second thickness $T_2$ and the third thickness $T_3$ may be about 2.84 nm or 3.1 nm, while at a pressure of 15 torr the difference may be about 1 nm. However, any suitable thickness differences may be utilized.

By utilizing the embodiments described herein, a high-quality etch stop layer 401 may be obtained. For example, in an embodiment in which the etch stop layer 401 is silicon nitride, the embodiments herein can obtain a density of about 2.92 g/cm3, a stress of about 0.2 Gpa, a first wet etch rate (to remove a complex film of oxidized silicon nitride and pure silicon nitride at the top of the etch stop layer 401) of between about 3 Å/min and about 20 Å/min, such as about 10.53 Å/min (in a 1:100 solution of dilute hydrofluoric acid), a second wet etch rate (for an intrinsixe remove rate of a bulk portion of the etch stop layer 401 of pure silicon nitride) of between about 1 Å/min and about 10 Å/min, such as about 5.05 Å/min (in a 1:100 solution of dilute hydrofluoric acid), a K-value of about 6.7, and a voltage breakdown of about 10.93 MV/cm (for <50 Å). However, any suitable material properties may be utilized.

Figure 5:
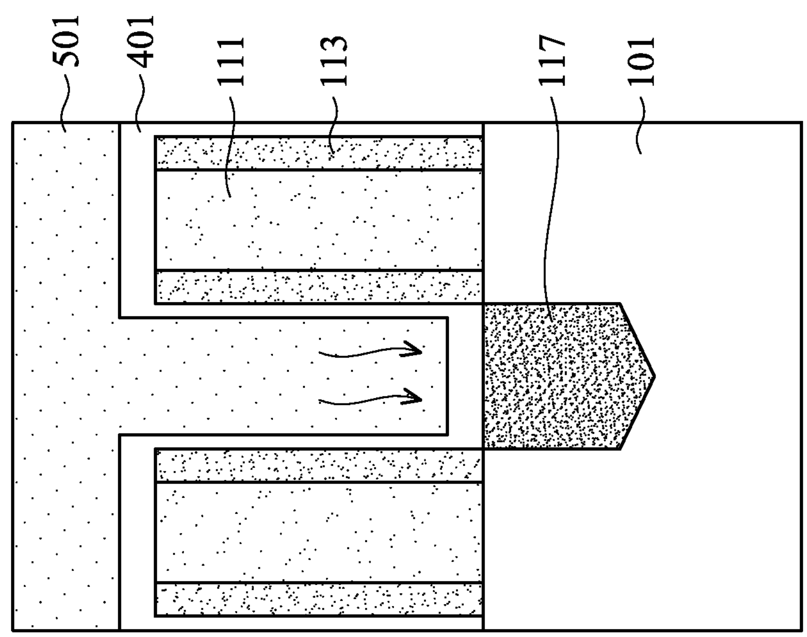
FIG. 5 illustrates a deposition of a dielectric layer in accordance with some embodiments.

FIG. 5 illustrates a formation of an inter-layer dielectric (ILD) layer 501 (e.g., an ILD0 layer). The ILD layer 501 may comprise a material such as silicon oxide ($SiO_2$) or boron phosphorous silicate glass (BPSG), although any suitable dielectrics may be used. The ILD layer 501 may be formed using a process such as PECVD, although other processes, such as LPCVD, may alternatively be used. The ILD layer 501 may be formed to a thickness of between about 100 Å and about 3,000 Å.

Once formed, the ILD layer 501 may be annealed using, e.g. a first annealing process. In an embodiment the first annealing process may be a thermal anneal wherein the substrate 101 and the ILD layer 501 are heated within, e.g., a furnace, within an inert atmosphere. The first anneal process may be performed at a temperature of between about 200° C. and about 1000° C., such as about 500° C., and may be continued for a time of between about 60 s and about 360 min, such as about 240 min.

However, by utilizing the anisotropic deposition process to form the etch stop layer 401 to have the second thickness $T_2$ be larger along the bottom of the opening, the structures underlying the etch stop layer 401 are better protected during the annealing process. In particular, because the etch stop layer 401 has a larger thickness along a bottom surface of the opening, the etch stop layer 401 can better protect the underlying source/drain region 117 (e.g., epitaxial material) from undesired loss of the source/drain region 117 from oxidation during the first annealing process. For example, there may be an oxygen penetration depth into the source/drain region 117 of less than about 16 Å, such as less than about 10 Å because of the presence of the thicker etch stop layer 401. As such, fewer defects from undesired oxidation occur.

Figure 6:
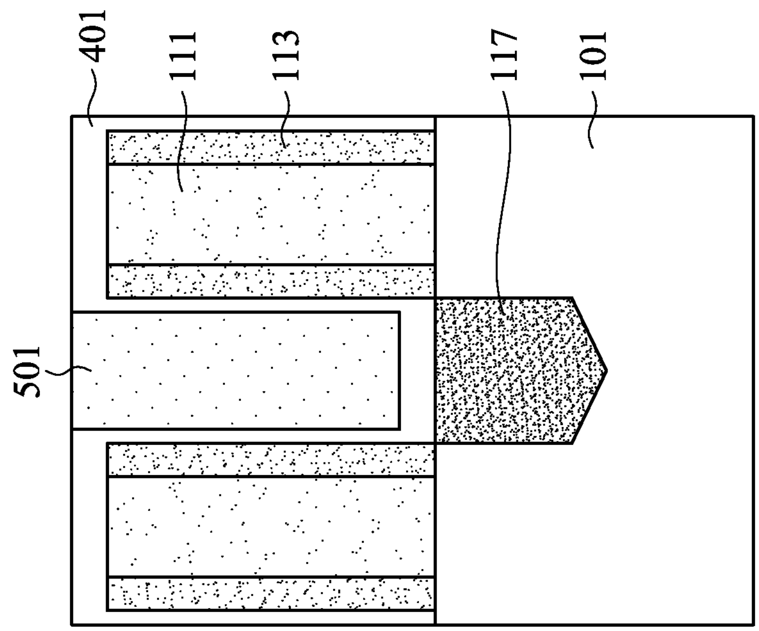
FIG. 6 illustrates a planarization process in accordance with some embodiments.

FIG. 6 illustrates that, after the ILD layer 501 has been annealed by the first annealing process, the ILD layer 501 may be planarized in order to prepare the ILD layer 501 for further processing. In an embodiment the ILD layer 501 may be planarized using a planarization process such as chemical mechanical polishing (CMP) so that the ILD layer 501 is coplanar with the etch stop layer 401. However, any other suitable method, such as one or more etching processes, may also be utilized.

Additionally, by utilizing the anisotropic deposition process to form the etch stop layer 401 to have a second thickness $T_2$ be larger along the upper surfaces of the stack 115, the structures underlying the etch stop layer 401 are better protected during the planarization process. In particular, because the etch stop layer 401 has a larger thickness along a surface of the stack 115, the etch stop layer 401 can better protect the underlying stack 115 and first spacers 113 from undesired damage during the planarization process (e.g., CMP overpolish). As such, fewer defects from the planarization process occur.

Once the ILD layer 501 has been planarized, the ILD layer 501 may again be annealed using, e.g. a second annealing process. In an embodiment the second annealing process may be a thermal anneal wherein the substrate 101 and the ILD layer 501 are heated within, e.g., a furnace, within an inert atmosphere. The second annealing process may be performed at a temperature of between about 200° C. and about 1000° C., such as about 500° C., and may be continued for a time of between about 60 s and about 360 min, such as about 240 min.

Figure 7:
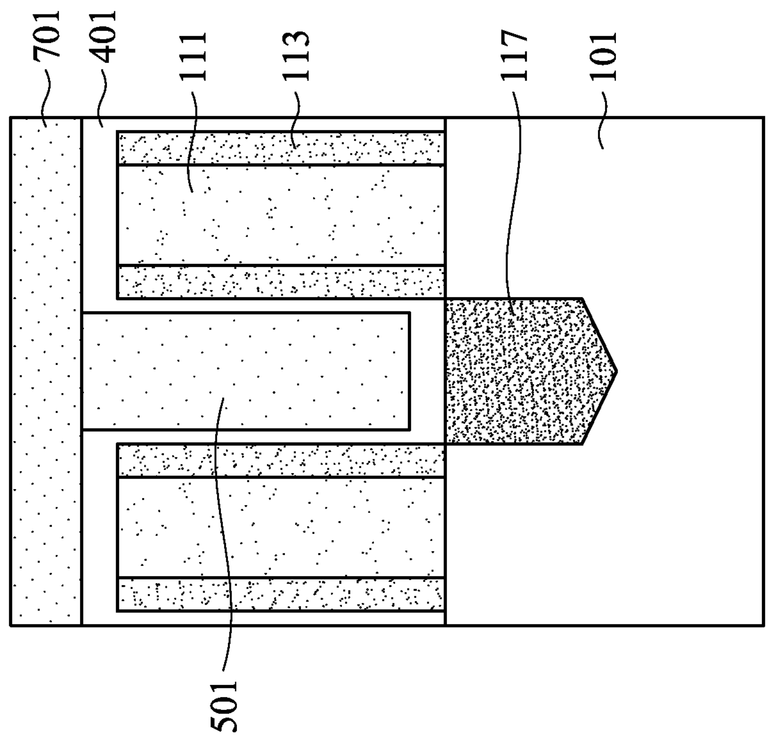
FIG. 7 illustrates a deposition of a hardmask in accordance with some embodiments.

FIG. 7 illustrates a formation of a hardmask 701 over the ILD layer 501 and the etch stop layer 401. In an embodiment the hardmask 701 may be a dielectric material such as silicon nitride and may be formed using a process such as CVD, PVD, ALD, combinations of these, or the like. However, any other suitable materials and any other suitable processes may be utilized to form the hardmask 701.

Figure 8:
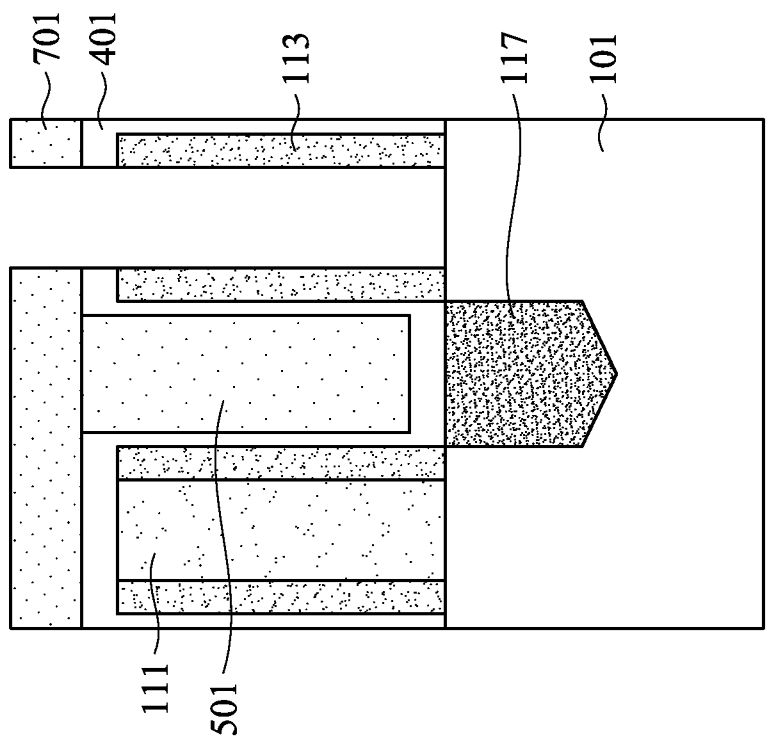
FIG. 8 illustrates a patterning of the hardmask in accordance with some embodiments.

FIG. 8 illustrates that, once the hardmask 701 has been placed, the hardmask 701 is patterned in order to expose a portion of a first one of the dummy gate electrodes 111. In an embodiment the hardmask 701 may be patterned by depositing and then exposing a photosensitive material onto the hardmask 701. The impact of the energy from the exposure will cause a chemical reaction in those parts of the photosensitive material that were impacted by the energy, thereby modifying the chemical properties of the exposed portions of the photoresist such that the chemical properties of the exposed portions of the photosensitive material are different from the chemical properties of the unexposed portions of the photosensitive material. The photosensitive material may then be developed with, e.g., a developer, in order to separate the exposed portion of the photosensitive material from the unexposed portion of the photosensitive material, and then the hardmask 701 may be patterned using an anisotropic etch and the photosensitive material as a mask.

FIG. 8 additionally illustrates that, once the portion of the first one of the dummy gate electrodes 111 has been exposed through the hardmask 701, the portion of the first one of the dummy gate electrodes 111 and the dummy gate dielectric may be removed in order to "cut" the material of the dummy gate electrodes 111. In an embodiment the portion of the first one of the dummy gate electrodes 111 and the gate dielectric may be removed using, e.g., one or more etching processes such as a dry etching or wet etching process while the hardmask 701 remains in place to protect the remainder of the structure. However, any suitable process for removing the portion of the first one of the dummy gate electrodes 111 may be utilized.

Figure 9:
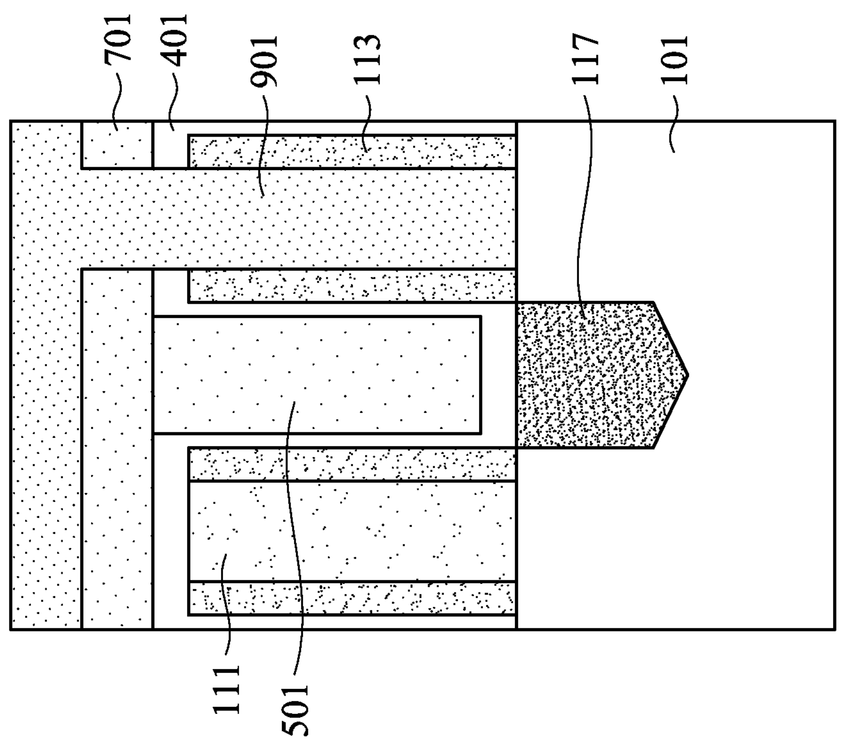
FIG. 9 illustrates a deposition of a dielectric layer in accordance with some embodiments.

FIG. 9 illustrates that, once the portion of the first one of the dummy gates 111 has been removed in order to cut the first one of the dummy gate electrodes 111, the portion removed may be replaced with a dielectric material 901. In an embodiment the dielectric material 901 may be a dielectric material such as silicon nitride and may be formed using a process such as CVD, PVD, ALD, combinations of these, or the like to fill and/or overfill the opening formed by the removal of the portion of the first one of the dummy gate electrodes 111. However, any other suitable materials and any other suitable processes may be utilized to form the dielectric material 901.

Figure 10:
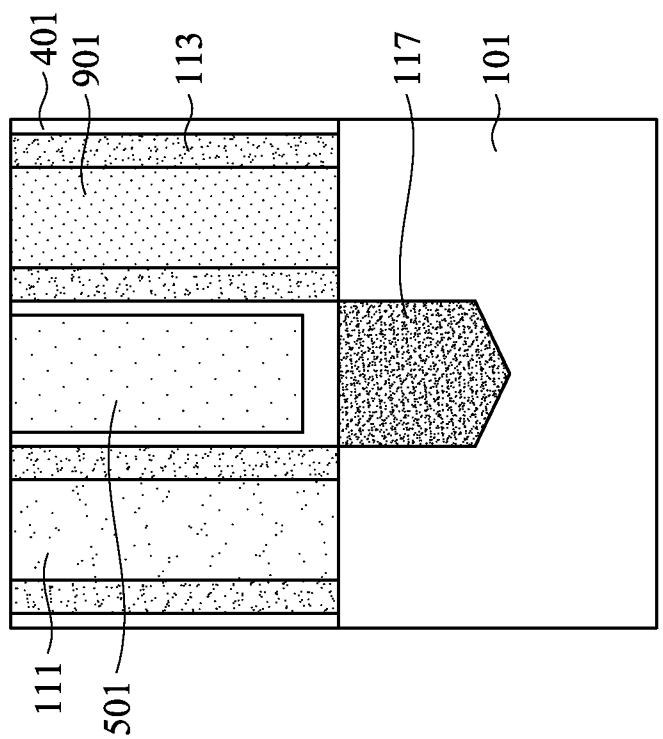
FIG. 10 illustrates a planarization of the dielectric layer in accordance with some embodiments.

FIG. 10 illustrates that, once the dielectric material 901 has been deposited to fill and/or overfill the opening, the dielectric material 901 may be planarized. In an embodiment the planarization may be performed using, e.g., a chemical mechanical polishing process. However, any suitable process, including etching and grinding processes, may be utilized.

Additionally, the planarization process may be used to not only remove those portions of the dielectric material 901 that extend outside of the first spacers 113, but also works to remove the hardmask 701 and portions of the etch stop layer 401 that remain over the first spacers 113. As such, the etch stop layer 401, the first spacers 113, the ILD layer 501, and the dielectric material 901 all share a coplanar surface with each other after the planarization process.

Figure 11:
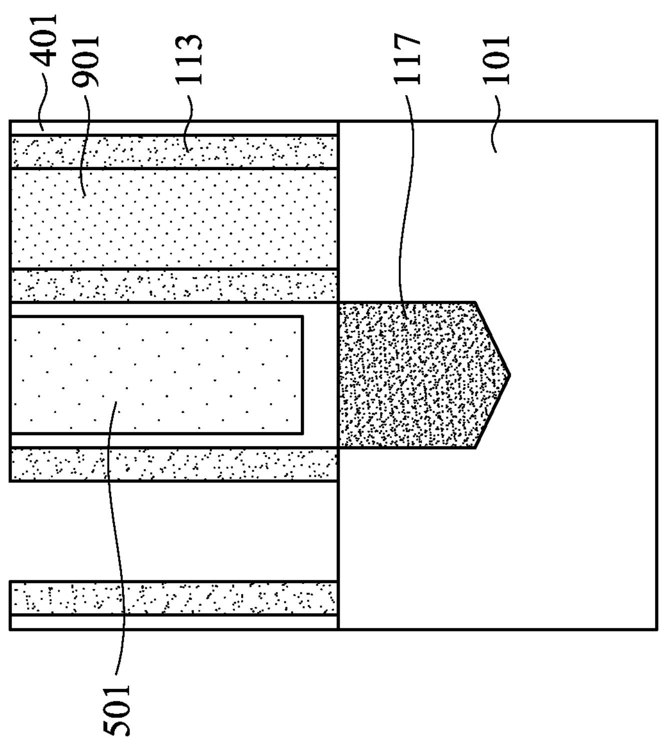
FIG. 11 illustrates a removal of the gate stack in accordance with some embodiments.

FIG. 11 illustrates that, once the dielectric material 901 has been planarized, the other ones of the dummy gate electrodes 111 and gate dielectric may be removed. In an embodiment, one or more etching processes, such as wet or dry etching processes, with etchants selective to the materials of the dummy gate electrodes 111 (e.g., polysilicon) and the dummy gate dielectric may be utilized. However, any suitable removal processes may be utilized.

Figure 12:
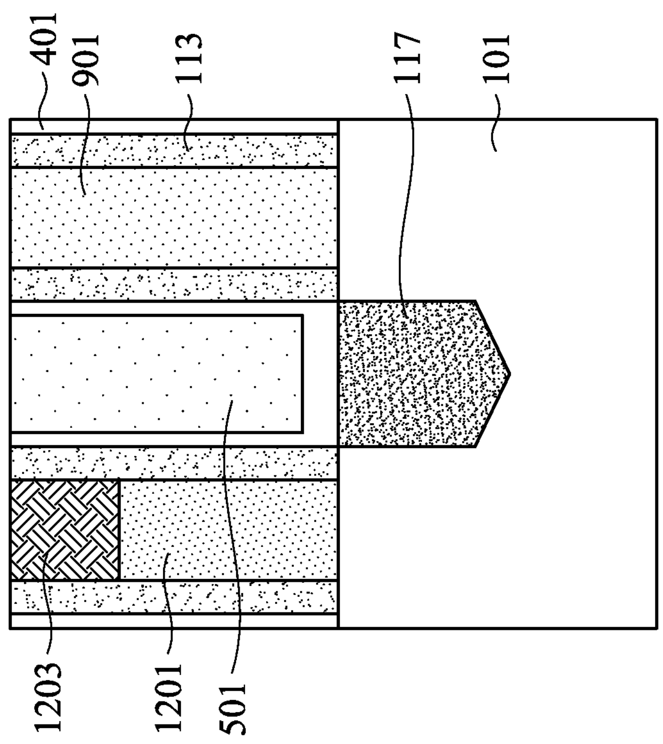
FIG. 12 illustrates a replacement gate in accordance with some embodiments.

FIG. 12 illustrates that once the dummy gate electrode 111 has been removed, the openings left behind may be refilled to form a gate stack 1201. In a particular embodiment the gate stack 1201 comprises a first dielectric material, a first metal material, a second metal material, and a third metal material. In an embodiment the first dielectric material is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The first dielectric material may be deposited to a thickness of between about 5 Å and about 200 Å, although any suitable material and thickness may be utilized.

The first metal material may be formed adjacent to the first dielectric material and may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material may be deposited using a deposition process such as atomic layer deposition, chemical vapor deposition, sputtering, or the like, to a thickness of between about 5 Å and about 200 Å, although any suitable deposition process or thickness may be used.

The second metal material may be formed adjacent to the first metal material and, in a particular embodiment, may be similar to the first metal material. For example, the second metal material may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the second metal material may be deposited using a deposition process such as atomic layer deposition, chemical vapor deposition, sputtering, or the like, to a thickness of between about 5 Å and about 200 Å, although any suitable deposition process or thickness may be used.

The third metal material fills a remainder of the opening left behind by the removal of the dummy gate electrode 111. In an embodiment the third metal material is a metallic material such as W, Al, Cu, AlCu, Ti, TiAlN, TaC, TaCN, TaSiN, Mn, Zr, TiN, Ta, TaN, Co, Ni, combinations of these, or the like, and may be deposited using a deposition process such as atomic layer deposition, chemical vapor deposition, sputtering, or the like to fill and/or overfill the opening left behind by the removal of the dummy gate electrode 111. In a particular embodiment the third metal material may be deposited to a thickness of between about 5 Å and about 500 Å, although any suitable material, deposition process, and thickness may be utilized.

Once the opening left behind by the removal of the dummy gate electrode 111 has been filled, the materials may be planarized in order to remove any material that is outside of the opening left behind by the removal of the dummy gate electrode 111. In a particular embodiment the removal may be performed using a planarization process such as chemical mechanical polishing. However, any suitable planarization and removal process may be utilized.

After the materials of the gate stack 1201 have been formed and planarized, the materials of the gate stack 1201 may be recessed and capped with a capping layer 1203. In an embodiment the materials of the gate stack 1201 may be recessed using, e.g., a wet or dry etching process that utilizes etchants selective to the materials of the gate stack 1201. However, any suitable process and distance may be utilized.

Once the materials of the gate stack 1201 have been recessed, the capping layer 1203 may be deposited and planarized with the first spacers 113. In an embodiment the capping layer 1203 is a material such as SiN, SiON, SiCON, SiC, SiOC, combinations of these, or the like, deposited using a deposition process such as atomic layer deposition, chemical vapor deposition, sputtering, or the like. The capping layer 1203 may be deposited to a thickness of between about 5 Å and about 200 Å, and then planarized using a planarization process such as chemical mechanical polishing such that the capping layer 1203 is planar with the first spacers 113.

Figure 13:
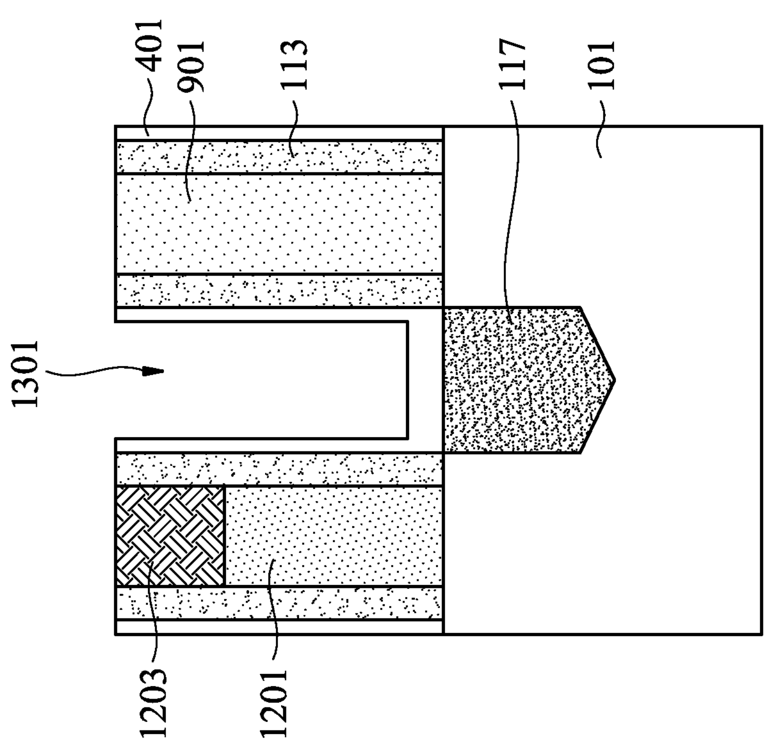
FIG. 13 illustrates a removal of dielectric material in accordance with some embodiments.

FIG. 13 illustrates a formation of a first opening 1301 through the ILD layer 501 in order to expose the etch stop layer 401 in preparation for formation of a first contact 1501 (not illustrated in FIG. 13 but illustrated and described below with respect to FIG. 15). In an embodiment the first opening 1301 may be formed using an etching process with reactants that are selective to the material of the ILD layer 501, which may be an anisotropic etching process such as a reactive ion etch process. However, any suitable process, such as a wet etching process, and any suitable reactants may be used.

However, by utilizing the anisotropic deposition process to form the etch stop layer 401 to have the second thickness $T_2$ be larger along the bottom of the opening, the structures underlying the etch stop layer 401 are protected during the etching process to remove the ILD layer 501. In particular, because the etch stop layer 401 has a larger thickness along a bottom surface of the opening, the etch stop layer 401 can better protect the underlying source/drain region 117 (e.g., epitaxial material) from undesired damage during the removal of the ILD layer 501. As such, fewer defects from undesired damage occur.

Additionally, the wet etch rate of the etch stop layer 401 may further be modified in order to provide even more protection. In an embodiment the RF power of the second electrode 229 during the introduction of the second precursor material may be modified in order to modify the wet etch rate of the etch stop layer 401. For example, in an embodiment in which the etch stop layer 401 is silicon nitride, the RF power may be set to about 300 W in order to obtain a wet etch rate of about 14.58 Å/3 minutes, while the power may be set to about 400 W to obtain a wet etch rate of about 16.32 Å/3 minutes, or the power may be set to about 500 W to obtain a wet etch rate of about 21.63 Å/3 minutes. In addition to allowing for further process variability, each of the wet etch rates are below a baseline of silicon nitride formed using a furnace atomic layer deposition process of about 40 Å/3 minutes.

Figure 14:
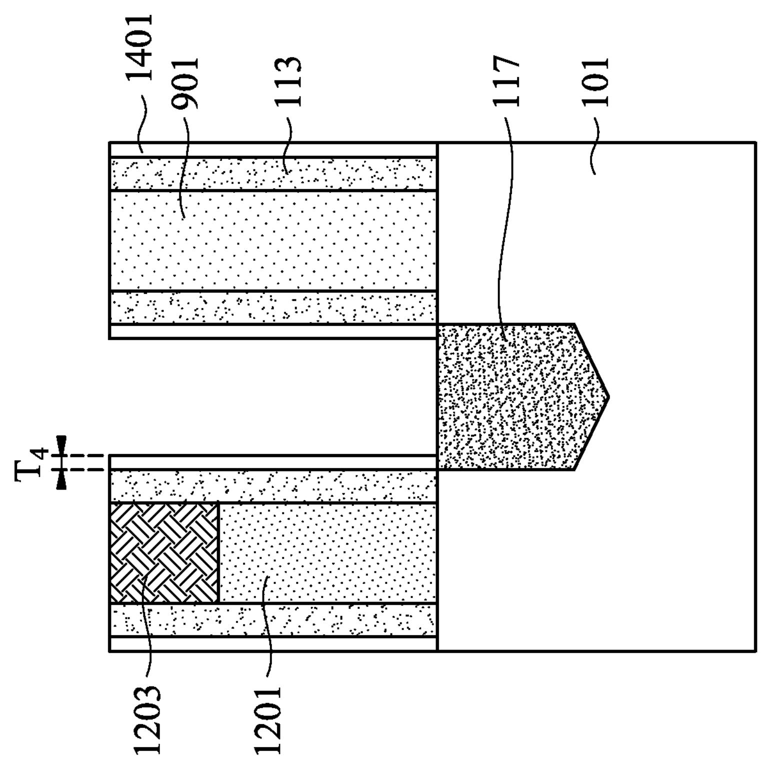
FIG. 14 illustrates a patterning of the etch stop layer in accordance with some embodiments.

FIG. 14 illustrates a formation of second spacers 1401 from the etch stop layer 401 and an exposure of the underlying source/drain regions 117. In an embodiment the second spacers 1401 may be formed using an anisotropic etch process which removes the portion of the etch stop layer 401 from the bottom of the opening while retaining those portions of etch stop layer 401 along the sidewalls and adjacent to the first spacers 113. In an embodiment the second spacers 1401 may be formed to have a fourth thickness $T_4$ of between about 0 Å and about 80 Å, such as about 40 Å. However, any suitable dimensions and any suitable method of formation may be utilized to form the second spacers 1401.

By utilizing the etch stop layer 401 to form the second spacers 1401, additional protection may be provided to the manufactured devices during operation. For example, the second spacers 1401 can help to prevent current leakage that could occur between the gate stack 1201 and the first contact 1501.

Figure 15:
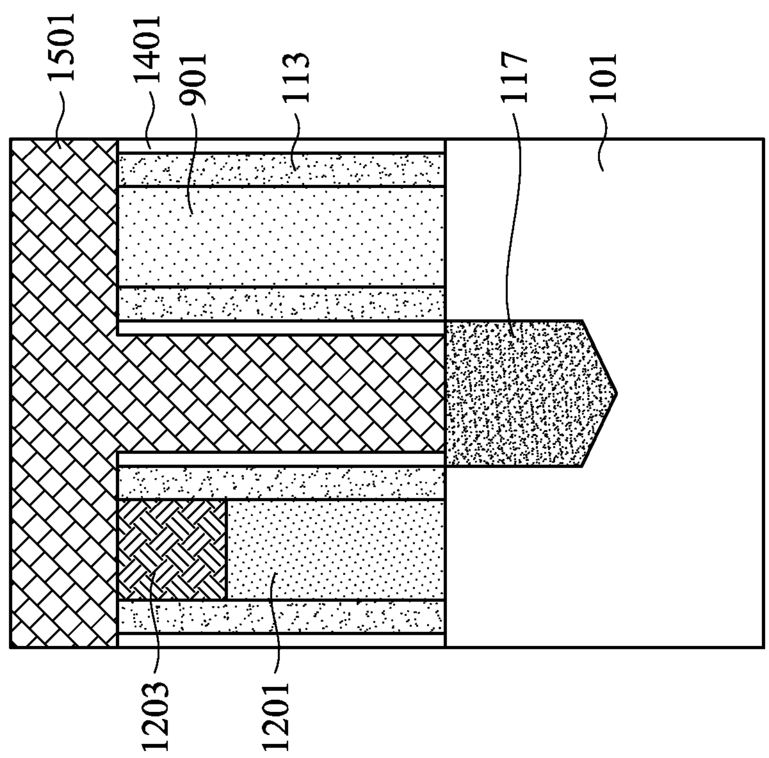
FIG. 15 illustrates a formation of a contact in accordance with some embodiments.

FIG. 15 illustrates a formation of the first contact 1501. Optionally, prior to formation of the first contact 1501, a silicide contact may be formed. The silicide contact may comprise titanium, nickel, cobalt, or erbium in order to reduce the Schottky barrier height of the contact. However, other metals, such as platinum, palladium, and the like, may also be used. The silicidation may be performed by blanket deposition of an appropriate metal layer, followed by an annealing step which causes the metal to react with the underlying exposed silicon. Un-reacted metal is then removed, such as with a selective etch process. The thickness of the silicide contact may be between about 5 nm and about 50 nm.

In an embodiment the first contact 1501 may be a conductive material such as Al, Cu, W, Co, Ti, Ta, Ru, TiN, TiAl, TiAlN, TaN, TaC, NiSi, CoSi, combinations of these, or the like, although any suitable material may be deposited into the opening using a deposition process such as sputtering, chemical vapor deposition, electroplating, electroless plating, or the like, to fill and/or overfill the opening. Once filled or overfilled, any deposited material outside of the opening may be removed using a planarization process such as chemical mechanical polishing (CMP). However, any suitable material and process of formation may be utilized. Additionally, the first contact 1501 may have a thickness of between about 5 Å and about 2000 Å.

By utilizing the embodiments described herein, multiple advantages may be obtained. For example, a larger process window may be utilized for processes following the deposition of the etch stop layer 401, which allows for a larger flexibility for further integration of process steps. Additionally, in embodiments in which the active devices and structures described herein are utilized in a ring oscillator, the ring oscillator has an increase in device performance.

In accordance with an embodiment, a method of manufacturing a semiconductor device includes: forming spacers adjacent to a gate stack over a semiconductor fin; and depositing an etch stop layer over the gate stack and adjacent to the spacers, the depositing the etch stop layer including: pulsing a first precursor over the gate stack, the first precursor being a non-plasma; and after the pulsing the first precursor, pulsing a second precursor over the gate stack, the second precursor being a plasma that is biased towards the semiconductor fin. In an embodiment the pulsing the first precursor and the pulsing the second precursor form a first material with multiple thicknesses. In an embodiment a first thickness is adjacent to the spacers and a second thickness larger than the first thickness is adjacent to the gate stack. In an embodiment the second thickness is larger than the first thickness by at least 2.84 nm. In an embodiment the method includes igniting the plasma over the semiconductor fin. In an embodiment the first precursor is diiodosilane 403 and the second precursor is nitrogen. In an embodiment the method includes etching the etch stop layer to form second spacers.

In accordance with another embodiment, a method of manufacturing a semiconductor device includes: forming a first gate stack and a second gate stack over a semiconductor fin; forming a first spacer adjacent to the first gate stack and a second spacer adjacent to the second gate stack; pulsing a first precursor to react in a self-limiting reaction to form a first reaction product on a surface of the first gate stack and a surface of the first spacer; anisotropically pulsing a first plasma towards the first reaction product to form a first monolayer of a first material; repeating the pulsing the first precursor and the anisotropically pulsing the first plasma to form an etch stop layer of the first material, the etch stop layer having a first thickness adjacent to the first spacer and a second thickness different from the first thickness over the first gate stack; and etching the etch stop layer to form second spacers adjacent to the first spacers. In an embodiment the first precursor is diiodosilane 403 and the first plasma is a nitrogen plasma. In an embodiment the method further includes igniting the first plasma over the semiconductor fin. In an embodiment the method further includes depositing a conductive material adjacent to the second spacer. In an embodiment the second thickness is greater than the first thickness. In an embodiment the second thickness is greater than the first thickness by at least 2.84 nm. In an embodiment the pulsing the first precursor occurs at a pressure of between about 2.5 torr and about 22.5 torr.

In accordance with yet another embodiment, a method of manufacturing a semiconductor device includes: placing a first spacer adjacent to a gate stack over a semiconductor fin over a substrate into a deposition chamber; performing a first step including pulsing diiodosilane 403 into the deposition chamber; purging the deposition chamber after the first step; performing a second step including: pulsing nitrogen into the deposition chamber; igniting the nitrogen into a plasma; and directing the plasma towards the substrate using a directional bias; and repeating the first step and the second step to build a layer of silicon nitride. In an embodiment the directing the plasma is performed by applying a bias to a first electrode within a holding mount of the deposition chamber. In an embodiment the directing the plasma is performed by applying a bias to a showerhead within the deposition chamber. In an embodiment the layer of silicon nitride has a first thickness adjacent the first spacer and a second thickness different from the first thickness adjacent to the gate stack. In an embodiment the second thickness is larger than the first thickness by at least 2.84 nm. In an embodiment the method includes: etching the layer of silicon nitride to expose a source/drain region; and depositing a conductive material to make contact with the source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:

forming spacers adjacent to a gate stack over a semiconductor fin; and depositing an etch stop layer over the gate stack and adjacent to the spacers, the depositing the etch stop layer comprising:

pulsing a first precursor over the gate stack a first time, the first precursor being a non-plasma;

after the pulsing the first precursor, pulsing a second precursor over the gate stack a first time, the second precursor being a plasma biased towards the semiconductor fin, the etch stop layer having a first thickness adjacent to the spacers and a second thickness larger than the first thickness over the gate stack, the plasma bias causing a growth rate boost to a portion of the etch stop layer, the etch stop layer comprising silicon nitride, wherein the first precursor is diiodosilane and the second precursor is nitrogen;

after the pulsing the second precursor, pulsing the first precursor a second time; and after the pulsing the first precursor the second time, pulsing the second precursor a second time, wherein the pulsing the second precursor is performed at a different RF power than the pulsing the second precursor the first time.

2. The method of claim 1, wherein the depositing the etch stop layer comprises depositing the etch stop layer over the semiconductor fin.

3. The method of claim 1, wherein the depositing the etch stop layer is performed with a bias formed with a first electrode and a second electrode, the first electrode being set at a power of greater than 0 W and less than about 1500 W.

4. The method of claim 3, wherein the second electrode is set at a power of between about 300 W and about 500 W.

5. The method of claim 1, further comprising igniting the plasma, the igniting occurring over the semiconductor fin.

6. The method of claim 1, further comprising etching the etch stop layer to form second spacers over the spacers.

7. The method of claim 1, wherein the pulsing the first precursor the first time is performed at a pressure over the semiconductor fin of between about 2.5 torr and about 22.5 torr.

8. A method of manufacturing a semiconductor device, the method comprising:

forming a first gate stack and a second gate stack over a semiconductor fin;

forming a first spacer adjacent to the first gate stack and a second spacer adjacent to the second gate stack;

pulsing a first precursor to react in a self-limiting reaction to form a first reaction product on a surface of the first gate stack and a surface of the first spacer;

anisotropically pulsing a first plasma towards the first reaction product to form a first monolayer of a first material;

repeating the pulsing the first precursor and the anisotropically pulsing the first plasma to form an etch stop layer of the first material, wherein each repetition has a different RF power, the etch stop layer having a first thickness adjacent to the first spacer and a second thickness larger than the first thickness over the first gate stack; and etching the etch stop layer to form a third spacer adjacent to the first spacer, the third spacer comprising silicon nitride, wherein the first precursor is diiodosilane and the first plasma is a nitrogen plasma.

9. The method of claim 8, further comprising igniting the first plasma, the ignition occurring over the semiconductor fin.

10. The method of claim 8, further comprising depositing a conductive material adjacent to the third spacer.

11. The method of claim 8, wherein a chamber pressure over the semiconductor fin during the pulsing the first precursor is between about 2.5 torr and about 22.5 torr.

12. The method of claim 11, wherein the chamber pressure is less than about 15 torr.

13. The method of claim 8, wherein the pulsing the first precursor occurs at a pressure over the semiconductor fin of between about 2.5 torr and about 22.5 torr.

14. The method of claim 8, further comprising generating the first plasma from ammonia.

15. A method of manufacturing a semiconductor device, the method comprising:

placing a substrate having a first spacer adjacent to a gate stack over a semiconductor fin into a deposition chamber;

performing a first step comprising pulsing diiodosilane into the deposition chamber;

purging the deposition chamber after the first step;

performing a second step comprising:

pulsing nitrogen into the deposition chamber;

igniting the nitrogen into a plasma; and directing the plasma towards the substrate using a directional bias; and repeating the first step and the second step to build a layer of silicon nitride, wherein a first repetition has a first RF power and a second repetition has a second RF power different from the first RF power.

16. The method of claim 15, wherein the directing the plasma is performed by applying a bias to a first electrode within a holding mount of the deposition chamber.

17. The method of claim 16, wherein during the directing the plasma a bias is applied to a showerhead within the deposition chamber.

18. The method of claim 15, wherein during the first step a temperature within the deposition chamber is between about 200° C. and about 600° C.

19. The method of claim 18, wherein during the first step the deposition chamber temperature is between about 200° C. and about 450° C.

20. The method of claim 15, further comprising:

etching the layer of silicon nitride to expose a source/drain region; and depositing a conductive material to make contact with the source/drain region.

* * * * *